United States Patent [19]

Bishop

[11] Patent Number: 4,833,455
[45] Date of Patent: May 23, 1989

[54] ANTI-TAMPER DEVICE FOR UTILITY METERS

[75] Inventor: Roy G. Bishop, Port Colborne, Canada

[73] Assignee: Micro-Port International Ltd., Ontario, Canada

[21] Appl. No.: 159,937

[22] Filed: Feb. 24, 1988

[30] Foreign Application Priority Data

May 7, 1987 [CA] Canada .................................. 536625

[51] Int. Cl.⁴ ........................ G08B 13/14; G01R 1/00
[52] U.S. Cl. ..................................... 340/568; 324/110
[58] Field of Search ................... 340/568, 531, 310 A, 340/870.02; 379/107; 324/110; 361/364; 346/14 MR; 200/61.59, 42.02, 43.04

[56] References Cited

U.S. PATENT DOCUMENTS

| 3,992,705 | 11/1976 | Langenfeld | 340/870.02 X |
| 4,542,337 | 9/1985 | Rausch | 340/568 X |
| 4,588,949 | 5/1986 | Becker et al. | 324/110 |
| 4,600,923 | 7/1986 | Hicks et al. | 340/870.02 |
| 4,749,938 | 6/1988 | Bishop | 324/110 |

Primary Examiner—Glen R. Swann, III
Assistant Examiner—Thomas J. Mullen, Jr.
Attorney, Agent, or Firm—Holman & Stern

[57] ABSTRACT

An anti-tamper device is disclosed for utility meters of the type comprises comprising a fixed base unit and a removable plug-in unit associated with said base unit. The device comprises an electronic indicator for generating a new indication in response to a trigger signal, and a detector operable in response to the insertion of said plug-unit into the fixed base to generate said trigger signal. A different indication is generated each time the plug-in unit is inserted into the fixed base, thereby facilitating the detection of meter tampering.

14 Claims, 1 Drawing Sheet

ANTI-TAMPER DEVICE FOR UTILITY METERS

BACKGROUND OF THE INVENTION

This invention relates to an anti-tamper device for utility meters of the type comprising a fixed base and a removable plug-in unit, and particularly to electricity meters.

The theft of electricity by meter tampering is a major problem in North America. It has been estimated that approximately 400 million dollars are lost annually as a result of meter tampering, most electricity meters have a wall-mounted base unit, which receives the meter cover. Connection is established by means of protruding pins that engage corresponding sockets in the base unit. Meter tamperers will often break the seal and either temporarily jam the meter mechanism, or in some cases invert the meter so that the meter count actually decreases. Sometimes the tamperer will claim that the seal was inadvertently damaged, in which case the tampering is hard to prove, and sometimes the tamperer will have access to a utility die, which permits him to re-seal the meter. Efforts to discourage electricity theft have so far met with relatively little success.

In view of the large number of meters in use, an effective anti-tamper device must be simple to manufacture and low in cost. One such device is described in U.S. Pat. No. 4,749,938 This device, based on mechanical principles, has proved to be effective in the field. An object of this invention is to provide an alternative device capable of meeting the requirements as to cost and manufacturing simplicity.

SUMMARY OF THE INVENTION

According to the present invention there is provided an anti-tamper device for utility meters of the type comprising a fixed base unit and a removable plug-in unit associated with said base unit, said device comprising electronic indication means for generating a new indication in response to a trigger signal, and detection means operable in response to the insertion of said plug-in unit into the fixed base to generate said trigger signal, whereby a different indication is generated each time the plug-in unit is inserted into the fixed base.

After installation of the plug-in unit the service engineer records the indication shown on the indication means. This can be a device displaying a random number generated by a random number generator. When the service engineer returns, he checks the number shown by the display device against the recorded number. A difference in the two numbers indicates unauthorized removal of the plug-in unit.

In a preferred embodiment the display device is activated by means of an external command. For this purpose a magnetic switch can be included in the circuitry so that when a magnet is brought into close proximity with the device the numbers generated by the random number generator appear in the display.

The detector conveniently is in the form of a pressure switch, which is actuated each time the plug-in unit is inserted into the base.

As a further precaution a warning device can be provided to indicate if the unit is improperly installed or the switch has been tampered with.

Preferably the device is adapted to be installed within the housing of the plug-in unit.

The invention will now be described in more detail, by way of example only, with reference to the accompanying drawings, in which:

FIG. 1 is a block diagram of an anti-tamper device in accordance with the invention; and FIG. 2 is a schematic diagram of a plug-in meter unit incorporating anti-tamper device in accordance with the invention.

DETAILED DESCRIPTION

Figure 1:
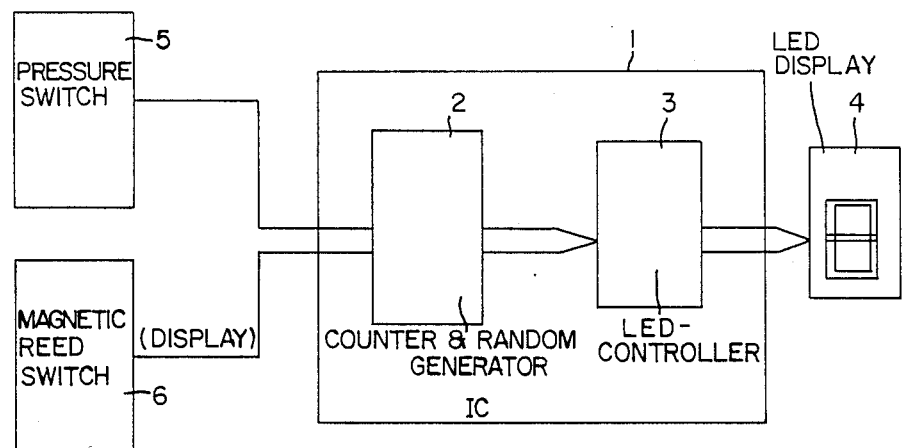

The anti-tamper device shown in the drawings is intended for utility meters of the type having a fixed base and a plug-in removable unit, and particularly electricity meters. The device comprises a custom-designed integrated circuit chip 1 including a counter and random number generator 2 coupled to a light-emitting-diode controller 3. The random number generator can be a pseudo-number generator, such as a shift register with feed back.

The LED controller 3 of the chip 1 is connected to an LED display 4 having four or five standard 7-segment digits.

A pressure switch 5, such as a micro-switch or a switch made from pressure sensitive material, is connected to the enable input of the counter and random number generator 2. A magnetic reed switch 6 is also connected to the counter and random number generator 2.

Figure 2:
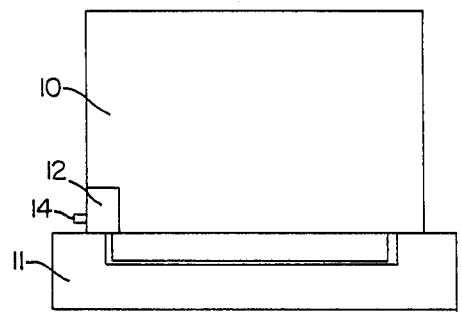

FIG. 2 shows in schematic view a conventional plug-in type meter 10 inserted into a base unit 11. A device 12 in accordance with the invention is installed within the plug-in unit 12 and includes a warning signal lamp 14 to indicate when the plug-in unit 11 has been improperly installed or tampered with.

The device is normally installed within the transparent housing of the removable plug-in unit of a standard domestic electricity meter. The pressure switch is located adjacent the bottom of the housing so that when the plug-in unit is inserted into the fixed base, the pressure switch is actuated. In the case of a micro-switch, for example, the switch can be normally open and closed upon insertion of the plug-in unit into the base. Closure of the micro-switch generates a trigger signal that causes the counter and random number generator 2 to generate a new random number.

The number generated by the counter and random number generator is not normally displayed in the LED display 4. Closure of the magnetic reed switch 6 connected to a second input of the generator enables the output and causes the current number to appear in the display. Normally the magnetic reed switch 6 is located within the housing and activated by means of a magnet outside the housing that is brought into proximity with the switch.

The device further includes a red warning lamp that is illuminated when the unit is improperly installed or the switch has been tampered with. As a further feature, after being activated the unit can be made to go into a time delay sequence, possibly 30 minutes or more, to add further security from tampering with the unit or its pressure switch. One of the advantages of the described device is that it can be used repeatedly, since the random number generator will continue to generate random numbers each time it is enabled by a signal from the pressure switch. As there is no predetermined sequence, a fraudulent customer has no means of causing the unit of generating the same number. For this reason it is preferred to use a true random number generator, but even if a pseudo-random number generator is employed, the fraudulent customer is unlikely to realize that the sequence will eventually repeat.

The unit is normally powered from the main electricity supply.

The preferred embodiment has been described in connection with a random number generator. In an alternative embodiment, the random number generator can be replaced by a high value counter. One such counter counts to 5 million before burning out. The counter never repeats and the 5 million count allows the plug-in unit to be removed as many times as is likely to be required during its lifetime. If desired only a portion of the seven digit number need be displayed in the display unit.

In a further embodiment, a unique code number is stored in a memory of the device. This acts as the address or identity for that particular device. The code is normally stored in the same integrated circuit that stores the count.

The device is provided with a radio transmitter to enable it to communicate with a mobile station. When the latter is in the vicinity of the device, the mobile station transmits a coded radio signal containing the identification code to the device. The device, which in turn incorporates a radio transmitter and receiver, recognizes the identification code and transmits the current count to the mobile station.

The operator can drive around a designated area polling by radio each device attached to the domestic electricity meters. The identification code and stored count for each device are recorded and stored in a computer. The computer then compares the recorded information with the information on file and identifies any discrepancies to initiate a service call to the premises having a device where a discrepancy is noted. If there has been in the meantime an authorized removal of the meter and resetting of the anti-tamper device, this fact can of course be entered in the station computer. With this system, the operator can make periodic trips around a neighborhood to determine whether any meter tampering has taken place.

Alternative means of remote communication can be employed, such as the superposition of signals on telephone or electricity lines or radio communication with a fixed central station.

Embodiments of the invention in which an exclusive property or privilege is claimed are defined as follows:

1. An anti tamper device for utility meters of the type comprising a fixed base unit and a removable plug-in unit associated with said base unit, said device comprising:
   electronic indication means for generating a new indication in response to a trigger signal, said electronic indication means comprising a random number generator and a display unit for displaying the number generated by said random number generator; and
   detection means operable in response to the insertion of said plug-in unit into the fixed base unit to generate said trigger signal, whereby a different indication is generated each time the plug-in unit is inserted into the fixed base unit.

2. A device as claimed in claim 1, wherein the display unit is operable to display the number generated by the random number generator in response to an external command.

3. A device as claimed in claim 2, comprising a magnetic switch responsive to said external command to activate the display unit.

4. A device as claimed in claim 1 wherein the device is adapted to be installed within said plug-in unit.

5. A device as claimed in claim 1 wherein said detection means comprises a pressure switch.

6. A device as claimed in claim 1 further comprising a warning signal lamp operable to indicate incorrect installation of the plug-in unit.

7. A device as claimed in claim 1 wherein the electronic indication means includes a counter capable of counting to a relatively high number to minimize the risk of the counter returning to the same count after repeated activation.

8. An anti tamper device for utility meters of the type comprising a fixed base unit and a removable plug-in unit associated with said base unit, said device comprising:
   electronic indication means for generating a new indication in response to a trigger signal, said electronic indication means comprising a pseudo-random number generator and a display unit for displaying the number generated by said pseudo-random number generator; and
   detection means operable in response to the insertion of said plug-in unit into the fixed base unit to generate said trigger signal, whereby a different indication is generated each time the plug-in unit is inserted into the fixed base unit.

9. A device as claimed in claim 8, wherein the display unit is operable to display the number generated by the number generator in response to an external command.

10. A device as claimed in claim 9, comprising a magnetic switch responsive to said external command to activate the display unit.

11. A device as claimed in claim 8, wherein the device is adapted to be installed within said plug-in unit.

12. A device as claimed in claim 8, wherein said detection means comprises a pressure switch.

13. A device as claimed in claim 8, further comprising a warning signal lamp operable to indicate incorrect installation of the plug-in unit.

14. A device as claimed in claim 8, wherein the electronic indication means includes a counter capable of counting to a relatively high number to minimize the risk of the counter returning to the same count after repeated activation.

* * * * *